(12) United States Patent
Yuk et al.

(10) Patent No.: US 9,640,417 B2
(45) Date of Patent: May 2, 2017

(54) CASSETTE TRANSFER APPARATUS AND CASSETTE TRANSFERRING METHOD USING THE SAME

(71) Applicant: Samsung Electronics Co., Ltd., Suwon-si, Gyeonggi-do (KR)

(72) Inventors: Nam-Su Yuk, Suwon-si (KR); Kyung-Won Kang, Suwon-si (KR); Tae-Hun Kim, Hwaseong-si (KR); Se-Ho Park, Yongin-si (KR); Juno Park, Seoul (KR); Yong-Won Lee, Yongin-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 98 days.

(21) Appl. No.: 14/494,669

(22) Filed: Sep. 24, 2014

(65) Prior Publication Data
US 2015/0117988 A1 Apr. 30, 2015

(30) Foreign Application Priority Data

Oct. 29, 2013 (KR) ........................ 10-2013-0129069

(51) Int. Cl.
*H01L 21/673* (2006.01)
*H01L 21/687* (2006.01)
*H01L 21/677* (2006.01)

(52) U.S. Cl.
CPC .. *H01L 21/67379* (2013.01); *H01L 21/67775* (2013.01); *H01L 21/68707* (2013.01); *H01L 21/6773* (2013.01); *H01L 21/67781* (2013.01)

(58) Field of Classification Search
CPC ......... H01L 21/67379; H01L 21/67775; H01L 21/6773; H01L 21/68707
USPC ................ 212/330; 414/222.01, 225.01, 740
See application file for complete search history.

(56) References Cited

U.S. PATENT DOCUMENTS

| | | | | |
|---|---|---|---|---|
| 2,819,347 A | * | 1/1958 | Henrikson | H04M 1/02 379/440 |
| 7,914,246 B2 | * | 3/2011 | Bachrach | H01L 21/6773 414/217.1 |
| 8,168,142 B2 | * | 5/2012 | Tajima | B01L 3/0244 422/554 |
| 2008/0118334 A1 | * | 5/2008 | Bonora | B65G 1/02 414/222.02 |
| 2010/0143084 A1 | | 6/2010 | Murata et al. | |

(Continued)

FOREIGN PATENT DOCUMENTS

| | | |
|---|---|---|
| JP | 09-221203 | 8/1997 |
| JP | 2009-302447 | 12/2009 |

(Continued)

*Primary Examiner* — Gerald McClain
*Assistant Examiner* — Ronald Jarrett
(74) *Attorney, Agent, or Firm* — Muir Patent Law, PLLC

(57) ABSTRACT

A cassette transfer apparatus includes a holding unit configured to hold a cassette having a wafer loaded therein, the cassette having at least one stepped part, and the holding unit including at least one holding part configured to have the at least one stepped part placed thereon. The at least one stepped part includes a pair of stepped parts provided at opposite surfaces of the cassette, and the at least one holding part includes a pair of holding parts that extends back and forth and is configured to have the pair of stepped parts placed thereon.

20 Claims, 14 Drawing Sheets

(56) References Cited

U.S. PATENT DOCUMENTS

2010/0310351 A1    12/2010  Akiyama
2011/0023417 A1*    2/2011  Finkowski ............. A21C 9/086
                                                            53/443

FOREIGN PATENT DOCUMENTS

| JP | 4826941 | 9/2011 |
| KR | 1020050055286 | 6/2005 |
| KR | 10-0551450 | 2/2006 |
| KR | 1020060018454 | 3/2006 |
| KR | 100806250 | 2/2008 |
| KR | 1020090069544 | 7/2009 |
| KR | 1020100054085 | 5/2010 |
| KR | 1020110013237 | 2/2011 |
| KR | 1020110061937 | 6/2011 |
| KR | 1020120056483 | 6/2012 |
| KR | 1020120056484 | 6/2012 |

* cited by examiner

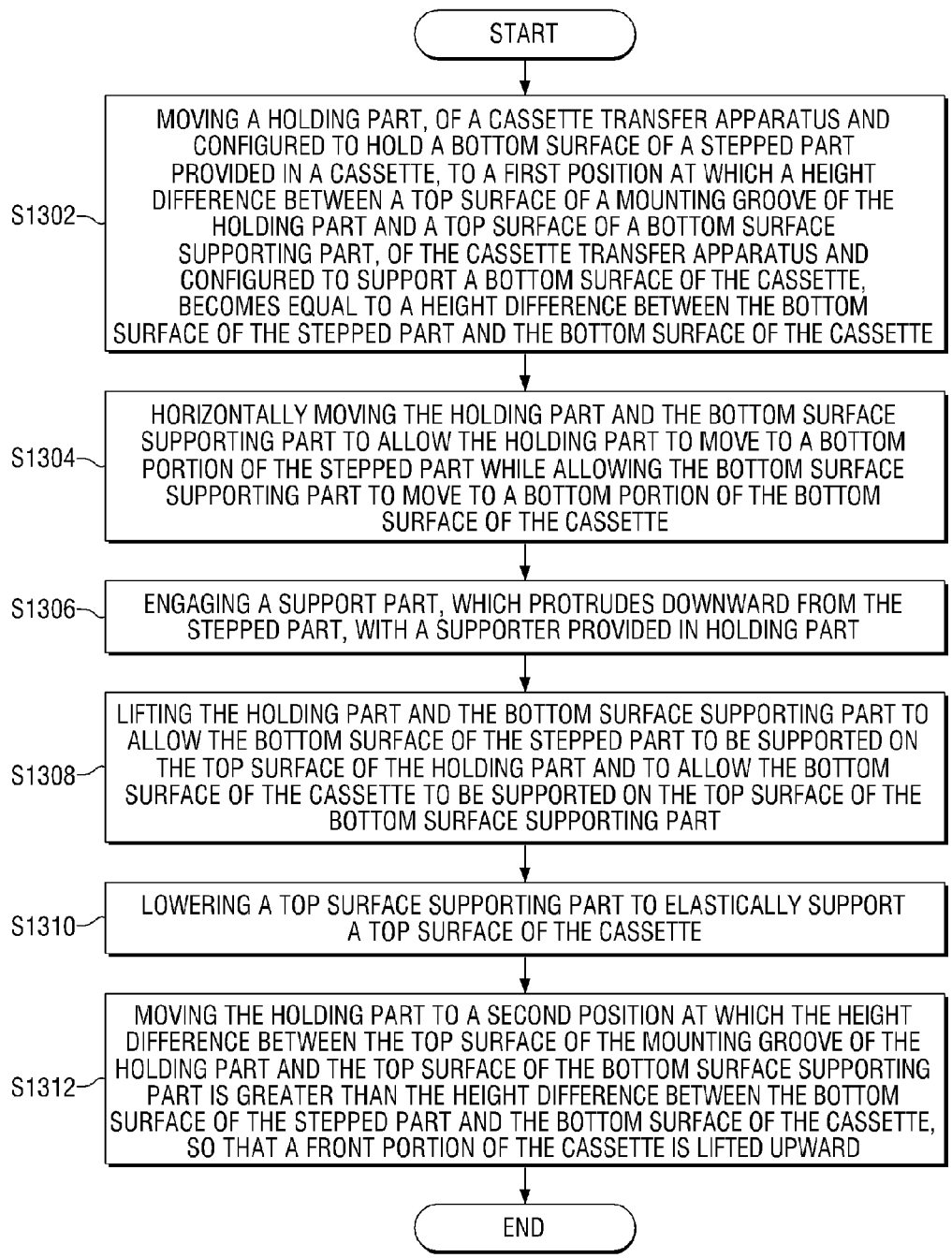

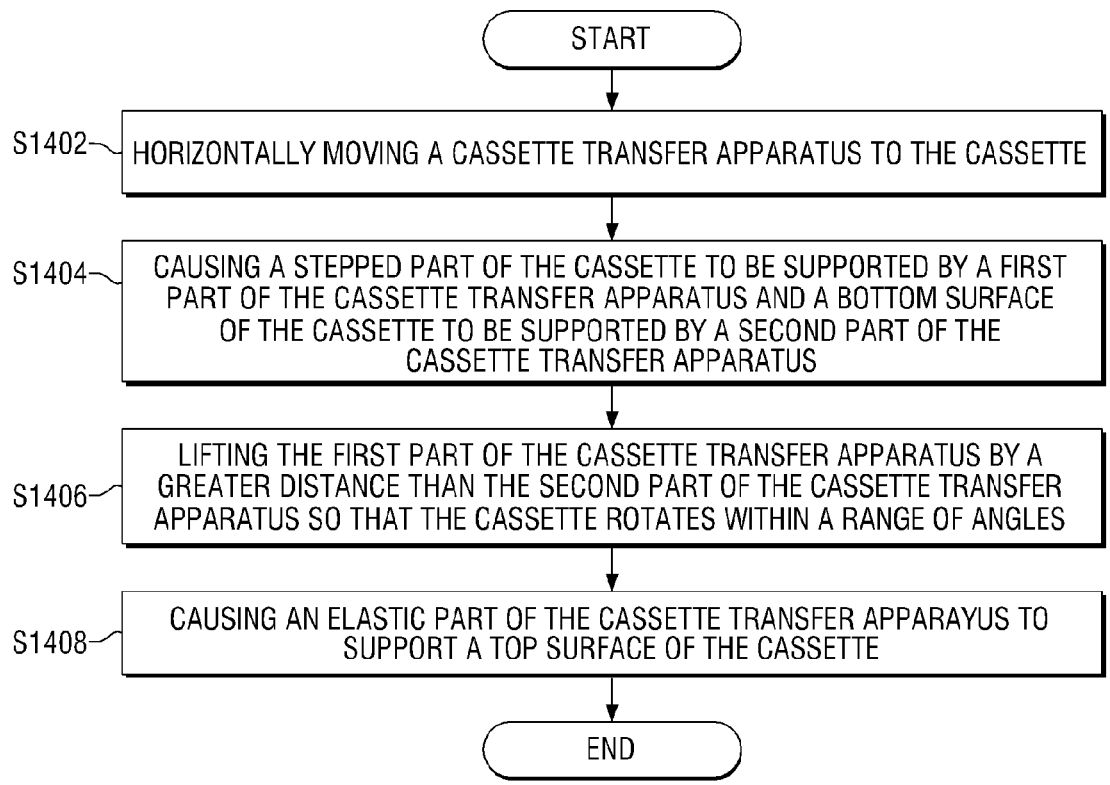

CASSETTE TRANSFER APPARATUS AND CASSETTE TRANSFERRING METHOD USING THE SAME

CROSS-REFERENCE TO RELATED APPLICATIONS

This application claims the benefit of priority under 35 U.S.C. §119 to Korean Patent Application No. 10-2013-0129069, filed on Oct. 29, 2013, in the Korean Intellectual Property Office, the content of which is incorporated herein in its entirety by reference.

BACKGROUND

1. Field

Embodiments of the present inventive concept relate to a cassette transfer apparatus, which may be configured to transfer a cassette that has wafers loaded therein by stably supporting the cassette, and a cassette transferring method using the same.

2. Description of the Related Art

A semiconductor product is manufactured by forming a predetermined integrated circuit on a wafer. In semiconductor product manufacturing, a single wafer is subjected to multiple processes including a first diffusion process to allow an oxide layer to grow on a wafer, an impurity implantation process and a second diffusion process to implant an impurity and to diffuse the implanted impurity into a silicon wafer to a desired depth, a photolithography process to form a mask (or a reticle) pattern on the wafer to selectively define a portion to be protected from etching or ion implantation, an etching process to selectively remove, using an etching gas or a chemical, thin films grown or deposited on a predetermined portion of the wafer, and a thin film forming process to form, using chemical vapor deposition, ion implantation, or metal deposition, a particular film.

In each of the processes, multiple unit process steps may be performed. For example, in the photolithography process, several unit process steps, including a coating of a photoresist step, a developing step, a baking step, an exposing step, and so on, are performed. In the coating of the photoresist step, the photoresist is coated on a wafer. In the developing step, a photoresist layer, formed on a predetermined portion of a surface of the wafer, which has undergone mask alignment and exposure, is removed using a developer solution to separately form a necessary portion and an unnecessary portion of the wafer. In the baking step, the wafer, which has been coated with the photoresist by a spin coater, is heated and then cooled to increase adhesion between the photoresist and the wafer surface. In the exposing step, using an optical lens, the mask pattern is reduced and exposed and configured to be transferred onto the wafer.

In order to increase product yields, multiple processing tools of each of various processing devices configured to perform the unit process steps are provided in each process bay and operated. Loading and unloading wafers from one processing device to another are conducted in units of lots (i.e., cassettes with 20 to 25 wafers) to be conveyed between processing devices. The lot unit wafers are mounted on a cassette and transferred by a cassette transfer apparatus from the processing devices in each process bay.

SUMMARY

Additional features and utilities of the present general inventive concept will be set forth in part in the description which follows and, in part, will be obvious from the description, or may be learned by practice of the general inventive concept.

The above and other objects of the present inventive concept are described in or are apparent from the following description of the embodiments.

The foregoing and/or other features and utilities of the present general inventive concept may be achieved by providing a cassette transfer apparatus including a holding unit configured to hold a cassette having a wafer loaded therein, wherein the cassette has at least one stepped part, and the holding unit includes at least one holding part configured to have the at least one stepped part placed thereon.

The at least one stepped part may include a pair of stepped parts provided at opposite surfaces of the cassette, and the at least one holding part may include a pair of holding parts that extends back and forth and may be configured to have the pair of stepped parts placed thereon.

The holding unit may include a bottom surface supporting part configured to support a bottom surface of the cassette, and the pair of holding parts may be configured to move upward relative to the bottom surface supporting part and to lift a front portion of the cassette to make the front portion of the cassette positioned higher than a rear portion of the cassette.

The holding unit may include a holding member and a lifting device. The holding member may include the pair of holding parts and a connection part that connects the pair of holding parts. The lifting device may be configured to lift the holding member.

The cassette may include a support part provided at each of the pair of stepped parts, and the holding unit may include a supporter installed at each of front ends of the pair of holding parts and configured to be engaged with the support part.

The support part may protrude downward from the stepped part and the supporter may include a mounting groove formed as a recess and configured to have the support part mounted thereon.

The supporter may include at least one guide surface that slopes downward toward the mounting groove and configured to guide the support part to the mounting groove.

The at least one guide surface may include a side guide surface provided on a side of the mounting groove and configured to slope downward toward the mounting groove, a front guide surface provided in front of the mounting groove and configured to slope downward toward the mounting groove, and a rear guide surface provided behind the mounting groove and configured to slope downward toward the mounting groove.

The cassette transfer apparatus may be configured to move between a first position and a second position. The first position may have a first height difference between a top surface of the mounting groove and a top surface of the bottom surface supporting part equal to a second height difference between a bottom surface of the stepped part and a bottom surface of the cassette. The second position may have the first height difference between the top surface of the mounting groove and the top surface of the bottom surface supporting part greater than the second height difference between the bottom surface of the stepped part and the bottom surface of the cassette.

The holding unit may include a top surface supporting part installed to be movable up and down and configured to elastically support a top surface of the cassette.

The holding unit may include a supporting member that extends up and down, has the top surface supporting part movably installed at a top portion of the supporting member, and has the bottom surface supporting part formed at a bottom portion of the supporting member.

The cassette may include a flange installed thereon, and opposite ends and a rear end of the flange may be spaced apart from a top surface of the cassette, so that the at least one stepped part may be formed by the opposite ends and the rear end of the flange.

The cassette may include a door at a front surface of the cassette, the door configured to open and to close.

The at least one holding part may have a "U" shape that corresponds to a shape formed by the opposite ends and the rear end of the flange.

The at least one holding part may include a mounting groove having a "U" shape that corresponds to a shape formed by the opposite ends and the rear end of the flange and configured to mount the opposite ends and the rear end of the flange.

The at least one holding part may have a guide surface that slopes downward toward the mounting groove.

The holding unit may include a connection arm that extends upward from the body and connects the body with the at least one holding part.

The holding unit may further include an elastic support unit installed on the connection arm and configured to elastically support the flange when the flange is held in the at least one holding part.

The foregoing and/or other features and utilities of the present inventive concept also provide a cassette transferring method including moving a holding part, of a cassette transfer apparatus and configured to hold a bottom surface of a stepped part provided in a cassette, to a first position at which a height difference between a top surface of a mounting groove of the holding part and a top surface of the bottom surface supporting part, of the cassette transfer apparatus and configured to support a bottom surface of the cassette, becomes equal to a height difference between the bottom surface of the stepped part and the bottom surface of the cassette, horizontally moving the holding part and the bottom surface supporting part to allow the holding part to move to a bottom portion of the stepped part while allowing the bottom surface supporting part to move to a bottom portion of the bottom surface of the cassette, and lifting the holding part and the bottom surface supporting part to allow the bottom surface of the stepped part to be supported on the top surface of the holding part and to allow the bottom surface of the cassette to be supported on the top surface of the bottom surface supporting part.

The cassette transferring method may further include engaging a support part, which protrudes downward from the stepped part, with a supporter provided in the holding part. The lifting operation may occur after the engaging operation.

The cassette transferring method may further include moving the holding part to a second position at which the height difference between the top surface of the mounting groove of the holding part and the top surface of the bottom surface supporting part may be greater than the height difference between the bottom surface of the stepped part and the bottom surface of the cassette, so that a front portion of the cassette may be lifted upward.

The cassette transferring method may further include lowering a top surface supporting part to elastically support a top surface of the cassette.

The foregoing and/or other features and utilities of the present inventive concept also provide a cassette transfer apparatus including a holding member configured to support a stepped part of a cassette.

The cassette transfer apparatus further includes a supporting member configured to support a bottom surface of the cassette.

The cassette transfer apparatus may further include a supporter disposed at an end of the holding member and configured to engage with a support part of the cassette.

The supporter may include a mounting groove configured to support the support part.

The supporter may further include a side guide surface provided on a side of the mounting groove and configured to slope downward toward the mounting groove, a front guide surface provided in front of the mounting groove and configured to slope downward toward the mounting groove, and a rear guide surface provided behind the mounting groove and configured to slope downward toward the mounting groove.

The supporting member may include a bottom surface supporting part and a top surface supporting part.

The top surface supporting part may be configured to move elastically to support a top surface of the cassette.

The holding member and the bottom surface supporting part may be configured to move from a first position to a second position.

A distance between the holding member and the bottom surface supporting part at the second position may be greater than a distance between the holding member and the bottom surface supporting part at the first position.

If the cassette is supported by the cassette transfer apparatus, then the cassette may be configured to rotate within a range of angles in response to the holding member and the bottom surface supporting part moving from the first position to the second position.

The foregoing and/or other features and utilities of the present inventive concept also provide a wafer transfer cassette including an exterior surface having a stepped part configured to be supported by a cassette transfer apparatus, and an interior receiving part configured to house wafers.

The wafer transfer cassette may further include a support part disposed at the stepped part and configured to be engaged with a mounting groove of the cassette transfer apparatus.

The foregoing and/or other features and utilities of the present inventive concept also provide a cassette transfer apparatus including a holding part configured to hold a substantially rectangular flange of a cassette.

The holding part may have a "U" shape configured to hold three edges of the substantially rectangular flange that are free from connection to an exterior surface of the cassette.

The holding part may have a mounting groove configured to mount the three edges of the substantially rectangular flange.

The holding part may have a guide surface configured to slope downward toward the mounting groove.

The cassette transfer apparatus may further include a connection arm configured to connect the holding part to a body of the cassette transfer apparatus.

The cassette transfer apparatus may further include an elastic support unit provided at the connection arm and configured to elastically support the substantially rectangular flange.

The foregoing and/or other features and utilities of the present inventive concept also provide a wafer transfer cassette including an exterior surface including a substantially rectangular flange configured to be supported by a cassette transfer apparatus, and an interior receiving part configured to house wafers.

The substantially rectangular flange may have one edge connected to the exterior surface and three edges free from connection to the exterior surface.

The wafer transfer cassette may further include a door disposed at an opening for the interior receiving part.

The foregoing and/or other features and utilities of the present inventive concept also provide a method of transferring a cassette including horizontally moving a cassette transfer apparatus to the cassette, causing a stepped part of the cassette to be supported by a first part of the cassette transfer apparatus and a bottom surface of the cassette to be supported by a second part of the cassette transfer apparatus, and lifting the first part of the cassette transfer apparatus by a greater distance than the second part of the cassette transfer apparatus so that the cassette rotates within a range of angles.

The method may further include causing an elastic part of the cassette transfer apparatus to support a top surface of the cassette.

The foregoing and/or other features and utilities of the present inventive concept also provide a non-transitory computer-readable recording medium containing instructions which, when executed by an electronic controller, cause the electronic controller to horizontally move a cassette transfer apparatus to the cassette, cause a stepped part of the cassette to be supported by a first part of the cassette transfer apparatus and a bottom surface of the cassette to be supported by a second part of the cassette transfer apparatus, and lift the first part of the cassette transfer apparatus by a greater distance than the second part of the cassette transfer apparatus so that the cassette rotates within a range of angles.

As described above, in the cassette transfer apparatus according to at least one embodiment of the present inventive concept, because the cassette may be transferred by applying a force to a stepped part, which may typically be installed in the cassette, using a holding part, it may not be necessary to separately install an additional element in order to transfer the cassette.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 13 is a flow chart illustrating a cassette transferring method according to an embodiment of the present inventive concept; and FIG. 14 is a flow chart illustrating a method of transferring a cassette according to an embodiment of the present inventive concept.

DETAILED DESCRIPTION OF THE EMBODIMENTS

Figure 1:
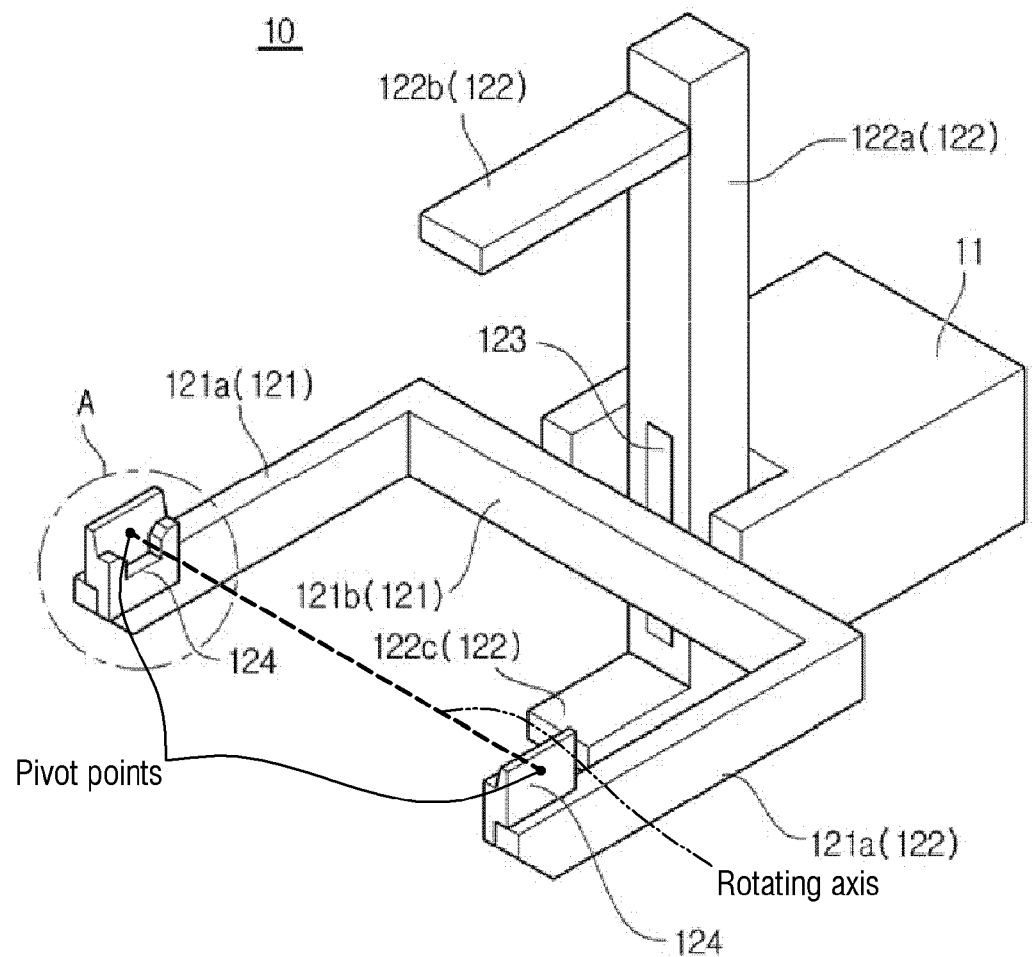
FIG. 1 is a perspective view of a cassette transfer apparatus according to an embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure is thorough and complete and fully conveys the concept of the inventive concept to those skilled in the art. The present inventive concept is only defined by the appended claims.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to", or "coupled to" another element or layer, it can be directly on, connected to, or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Below, a cassette transfer apparatus according to an embodiment of the present inventive concept is described in detail with reference to FIG. 1.

Figure 2:
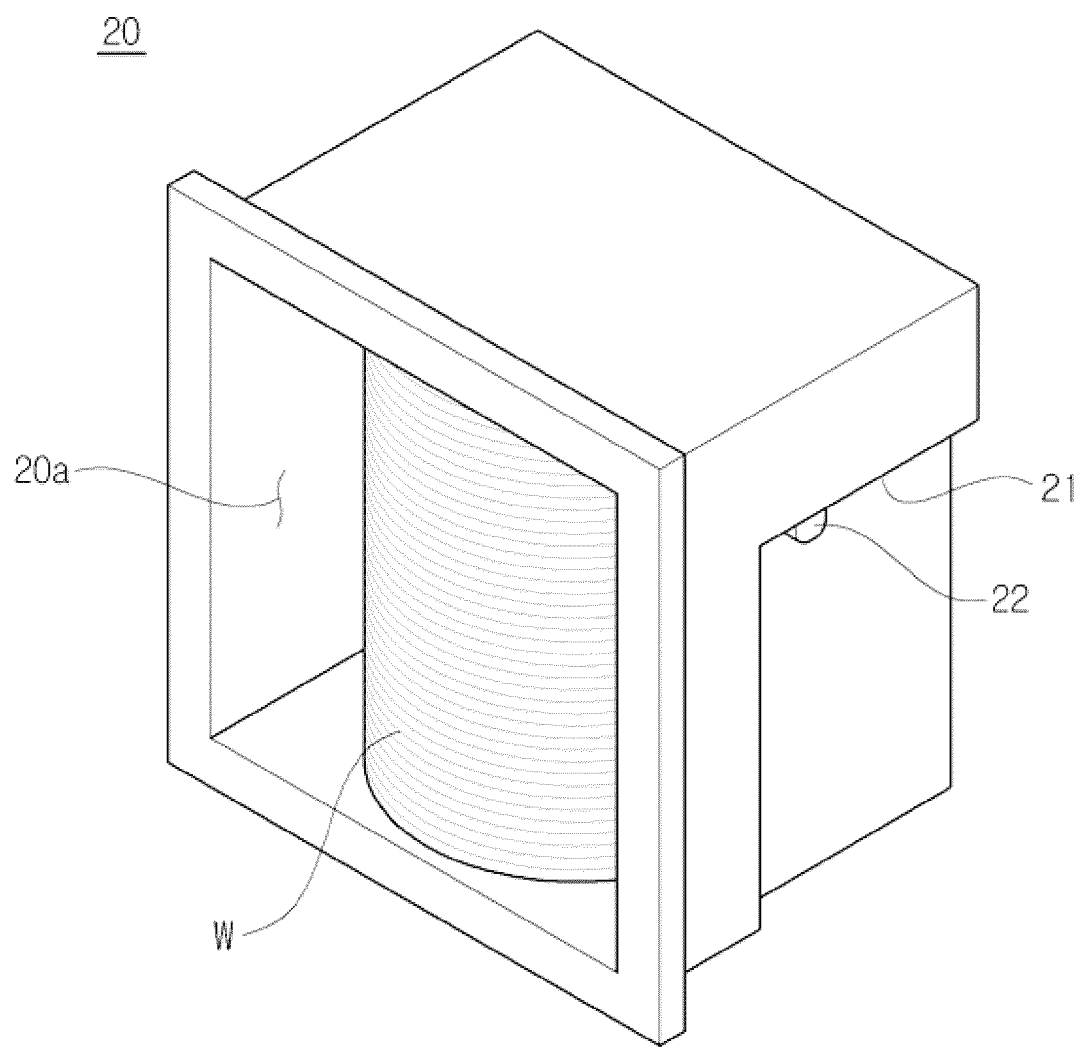
FIG. 2 is a perspective view of a front open shipping box (FOSB) type cassette transferred by the cassette transfer apparatus illustrated in FIG. 1.

As illustrated in FIGS. 1 and 2, a cassette transfer apparatus 10, according to an embodiment of the present inventive concept, to hold and transfer the cassette 20 may include a body 11 and a holding unit 12 connected to the body 11 and configured to hold the cassette 20.

The cassette 20 may have, for example, a box-shaped body with an open front surface so that a plurality of wafers W may be received in a receiving part 20a of the cassette 20 through the open front surface of the cassette 20. Stepped parts 21 configured to be placed on holding parts 121a, to be described below, may be formed on opposite surfaces of the cassette 20 with a step difference. In addition, a support part 22 configured to be engaged with a supporter 124, to be described below, may downwardly protrude from each front end of the stepped parts 21. In an embodiment of the present inventive concept, a front open shipping box (FOSB) type cassette 20, transferred in a state in which a front portion of the receiving part 20a is opened, may be used as the cassette 20.

Figure 4:
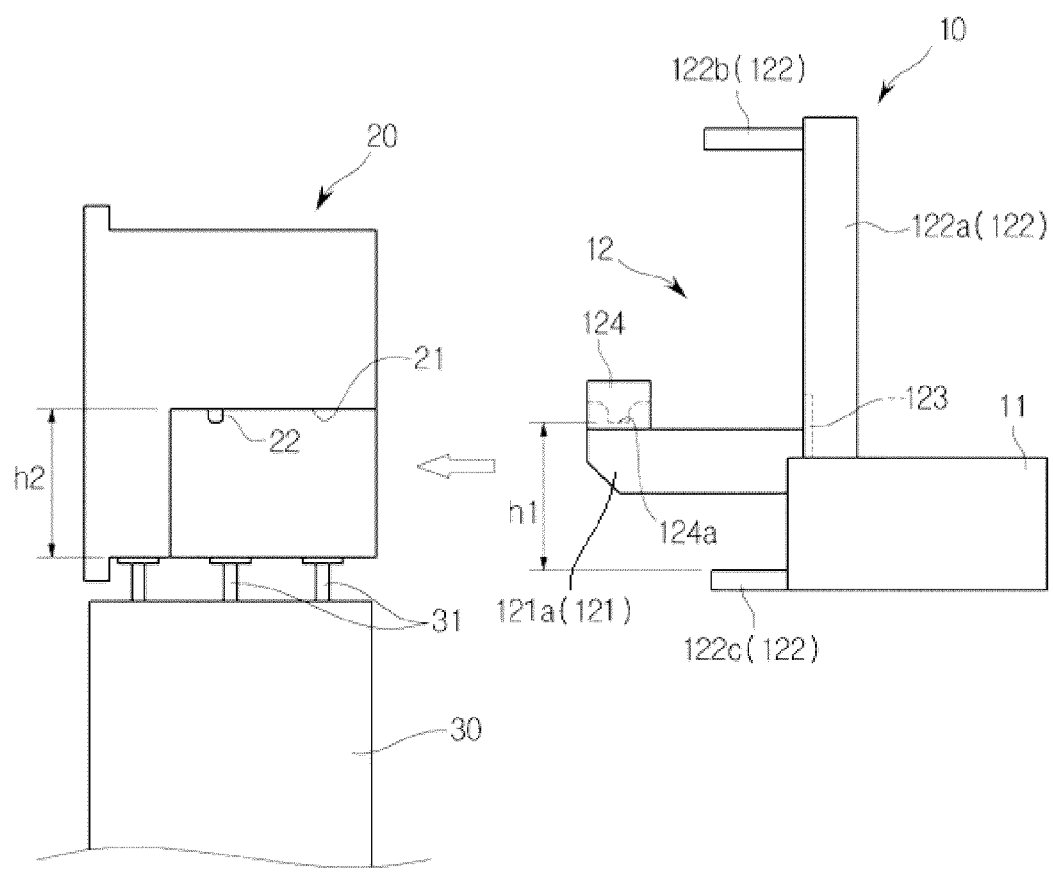
FIGS. 4 to 9 are side views sequentially illustrating a cassette holding process that uses the cassette transfer apparatus illustrated in FIG. 1.

As illustrated in FIG. 4, the cassette 20 may configured to be placed on a worktable 30. A plurality of pins 31 may be arranged on the worktable 30 such that a bottom surface of the cassette 20 and a top surface of the worktable 30 are spaced apart from each other, thereby allowing the cassette 20 to be indirectly placed on the worktable 30 through the plurality of pins 31.

As illustrated in FIG. 1, the holding unit 12 may include a holding member 121 configured to hold and transfer the cassette 20, and a supporting member 122 configured to support the cassette 20 held by the holding member 121. In an present embodiment of the present inventive concept, the holding member 121 may be installed on the supporting member 122 so as to be movable up and down through a lifting device 123 that guides lifting and lowering of the holding member 121.

The holding member 121 may include the pair of holding parts 121a, each of which extends forward to be parallel with the other and spaced apart from the other, the pair of holding parts 121a configured so that the stepped parts 21 of the cassette 20 are placed thereon. The holding member 121 may also include a connection part 121b that extends in left and right directions to connect the pair of holding parts 121a, the connection part 121b installed on the supporting member 122 so as to be movable up and down by the lifting device 123. With this configuration, the holding member 121 may be formed substantially in a "U" shape.

In response to the cassette transfer apparatus 10 moving upwardly, the holding parts 121a may apply a force to the cassette 20 through the stepped parts 21 to move the cassette 20 upwardly so that a bottom surface of the cassette 20 may be alienated from the worktable 30, which may allow the cassette 20 to be movable.

In an embodiment of the present inventive concept, as described above, the holding member 121 that has the holding parts 121a may be installed so as to be movable up and down by means of the lifting device 123. That is to say, the holding parts 121a may be allowed to move upwardly with respect to a bottom surface supporting part 122c, to be described below, so that the cassette 20 may be rotated by the holding parts 121a and the front portion of the cassette 20 may be lifted upwardly, thereby making the front portion of the cassette 20 positioned higher than a rear portion of the cassette 20.

With this configuration, the front portion of the cassette 20 may be made to be positioned higher than the rear portion of the cassette 20. Accordingly, the wafers W received in the cassette 20 may also be arranged to downwardly slope toward a rear bottom portion of the cassette 20, thereby preventing the wafers W from deviating from in the cassette 20 through the open front surface of the receiving part 20a during the process of transferring the cassette 20.

The supporter 124, configured to be engaged with the support part 22 of the cassette 20, may be installed at each front end of the pair of holding parts 121a so that a state in which the cassette 20 is held by the holding parts 121a may be stably maintained.

Figure 3:
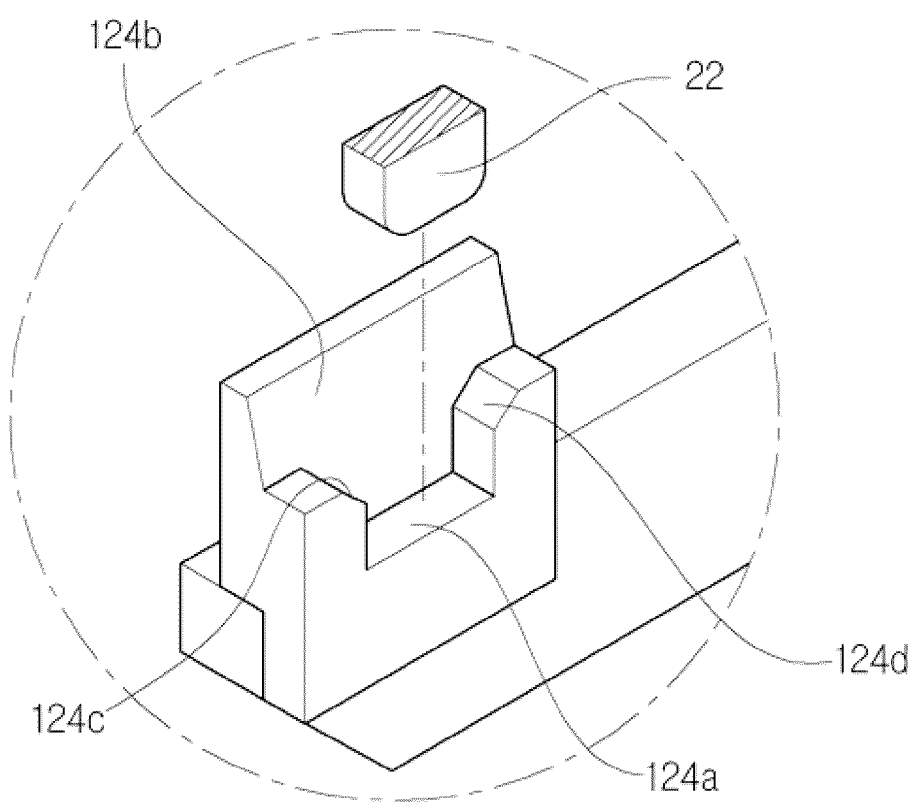
FIG. 3 is an enlarged view illustrating a portion 'A' illustrated in FIG. 1.

As illustrated in FIG. 3, the supporter 124 may include, for example, a mounting groove 124a shaped to correspond to the support part 22 of the cassette 20 and configured to have the support part 22 of the cassette 20 mounted therein, and a plurality of guide surfaces 124b, 124c, and 124d connected to downwardly slope toward the mounting groove 124a and to guide the support part 22 of the cassette 20 to the mounting groove 124*a*. In an embodiment of the present inventive concept, the plurality of guide surfaces 124*b*, 124*c*, and 124*d* may include a side guide surface 124*b* provided on either side of the mounting groove 124*a* and downwardly sloping toward the mounting groove 124*a*, a front guide surface 124*c* provided in front of the mounting groove 124*a* and downwardly sloping toward the mounting groove 124*a*, and a rear guide surface 124*d* provided behind the mounting groove 124*a* and downwardly sloping toward the mounting groove 124*a*. In an embodiment of the present inventive concept, the support part 22 of the cassette 20 may be configured to be positioned forward relative to the center of gravity of the cassette 20 that has the wafers W received therein.

Therefore, in the course of mounting the support part 22 of the cassette 20 in the mounting groove 124*a*, the cassette 20 may be aligned in the left and right directions by the side guide surfaces 124*b* provided on the supporters 124 while being aligned in the back and forth directions by the front guide surfaces 124*c* and the rear guide surfaces 124*d* provided on the supporters 124, thereby holding the cassette 20 at an accurate position using the holding parts 121*a*.

As illustrated in FIG. 1, the supporting member 122 may include an extension part 122*a* that extends in a vertical direction and is configured to be installed in the body 11, a top surface supporting part 122*b* that extends forward from a top portion of the extension part 122*a* and is configured to support a top surface of the cassette 20, and the bottom surface supporting part 122*c* that extends forward from a bottom portion of the extension part 122*a* and is configured to support the bottom surface of the cassette 20.

The top surface supporting part 122*b* may be installed on the extension part 122*a* to be movable up and down and may be configured to elastically support the top surface of the cassette 20.

The bottom surface supporting part 122*c*, which may support the bottom surface of the cassette 20, may also restrict rotation of the cassette 20 to be within a predetermined range of angles.

For example, in order to upwardly lift the front portion of the cassette 20 in response to the holding parts 121*a* being moved upwardly with respect to the bottom surface supporting part 122*c*, as illustrated in FIG. 4, the holding parts 121*a* may be configured to move between a first position and a second position. At the first position, a height difference h1 between a top surface of the mounting groove 124*a* and a top surface of the bottom surface supporting part 122*c* may be equal to a height difference h2 between the bottom surface of the stepped part 21 of the cassette 20 and the bottom surface of the cassette 20. At the second position, the height difference h1 between the top surface of the mounting groove 124*a* and the top surface of the bottom surface supporting part 122*c* may be greater than the height difference h2 between the bottom surface of the stepped part 21 of the cassette 20 and the bottom surface of the cassette 20. In a case in which the holding parts 121*a* are positioned at the first position, the cassette 20 may be positioned at a position in which its front and rear portions are at the same height. Then, in response to the holding parts 121*a* being moved to the second position, the cassette 20 may rotate and the front portion of the cassette 20 may be lifted upwardly. Accordingly, the front portion of the cassette 20 may be positioned higher than the rear portion thereof.

In an embodiment of the present inventive concept, for the purposes of aligning and stably holding the cassette 20, the support part 22 and the supporter 124 configured to be engaged with each other may be provided, respectively, in the cassette 20 and the holding part 121*a*, but the present inventive concept is not limited to this configuration. Alternatively, the holding part 121*a* may directly support the stepped part 21 of the cassette 20.

Below, the operation of the cassette transfer apparatus 10 according to an embodiment of the present inventive concept is described in detail with reference to the accompanying drawings.

Figure 5:
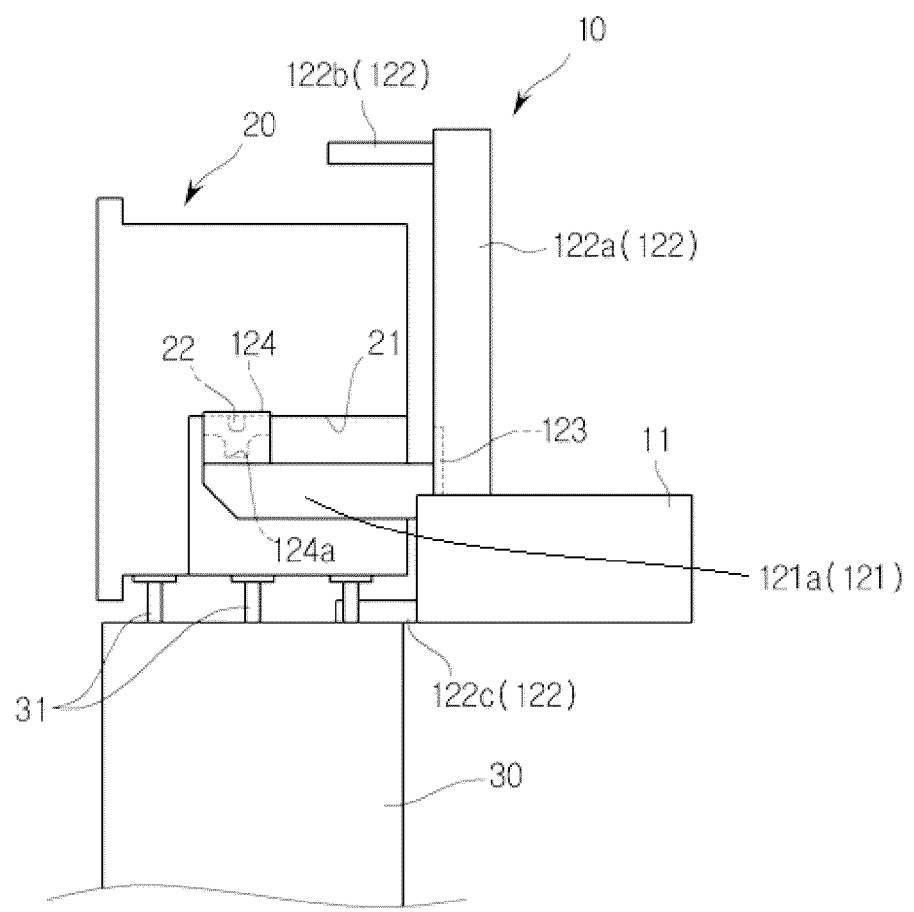

First, as illustrated in FIG. 4, in a state in which the holding part 121*a* of the holding member 121 is made to be positioned at the first position, the cassette transfer apparatus 10 may move horizontally from the rear portion to the front portion of the cassette 20. Accordingly, as illustrated in FIG. 5, the holding part 121*a* may enter a bottom portion of the stepped part 21 of the cassette 20, and the bottom surface supporting part 122*c* may enter a bottom portion of the bottom surface of the cassette 20 through a space between the plurality of pins 31 of the worktable 30.

Figure 6:
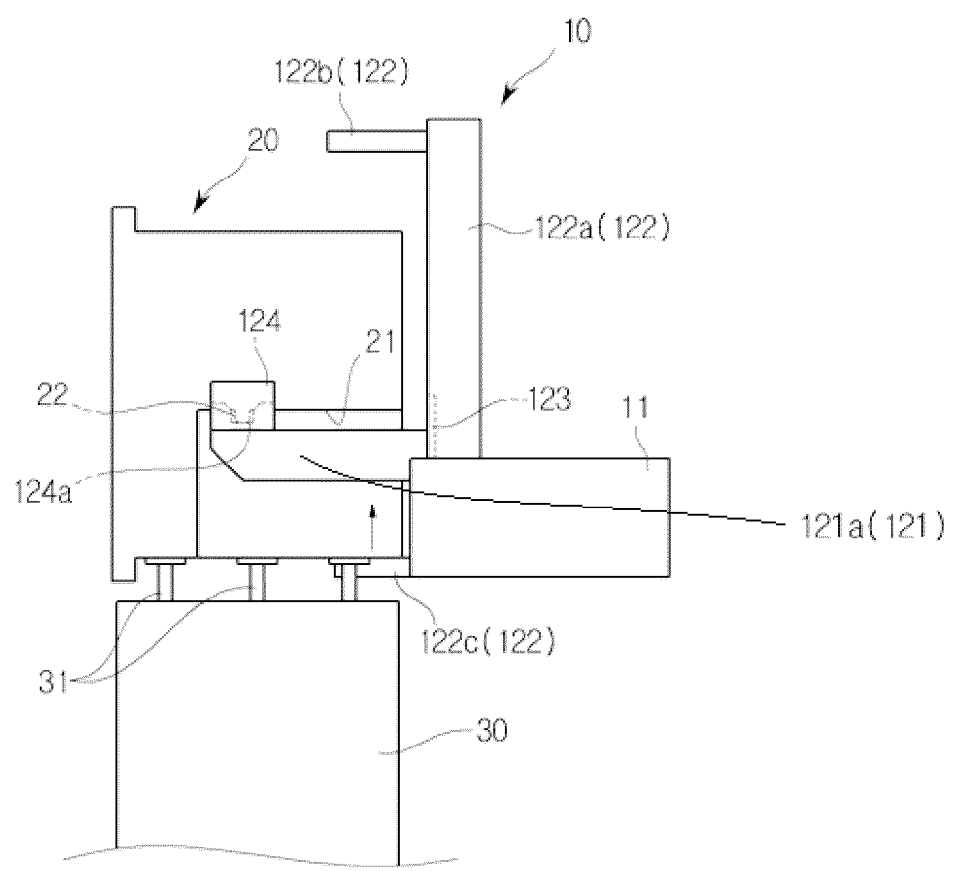
Figure 7:
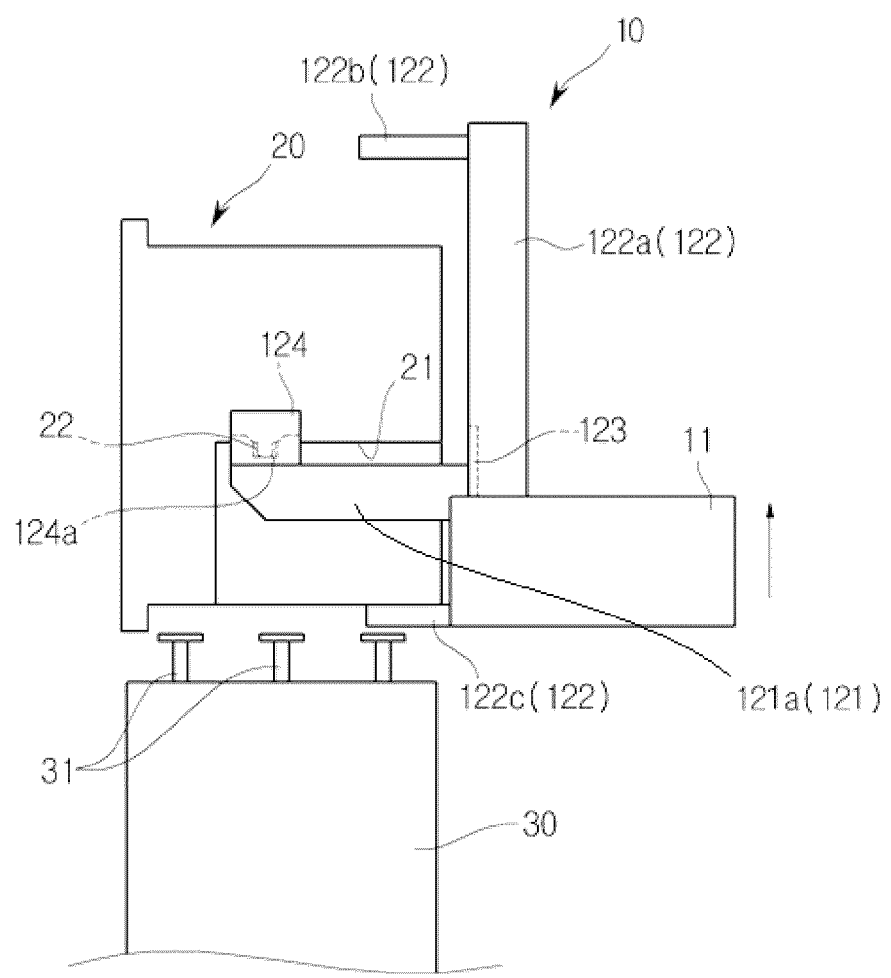

In such a state, in response to the cassette transfer apparatus 10 moving upwardly, as illustrated in FIG. 6, the supporters 124 provided in the holding parts 121*a* and the support part 22 of the cassette 20 may be engaged with each other, so that the cassette 20 may be held by the holding parts 121*a*. For example, while the supporter 124 and the support part 22 are engaged with each other, the support part 22 may be guided to the mounting groove 124*a* by the guide surfaces 124*b*, 124*c*, and 124*d* to accurately align the cassette 20 in forward, backward, and lateral directions.

in response to the cassette transfer apparatus 10 continuously moving upwardly, the cassette 20 may also move upwardly, as illustrated in FIG. 7, so that the bottom surface of the cassette 20 may become alienated from the plurality of pins 31 of the worktable 30.

Figure 8:
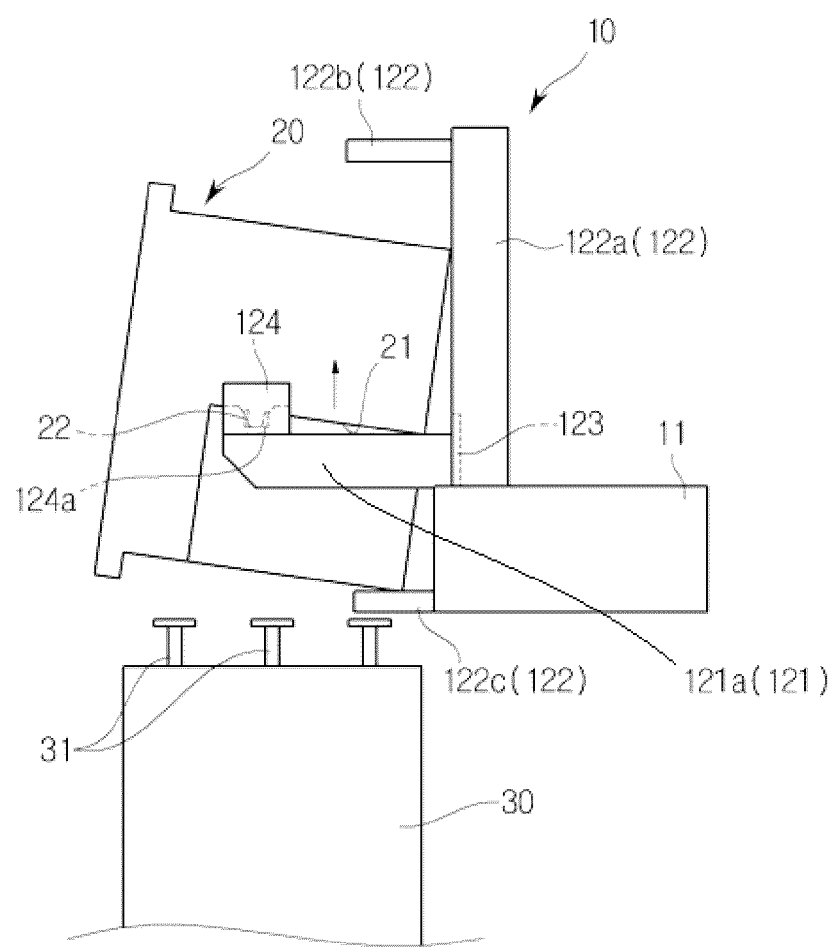

In such a state, in response to the holding parts 121*a* being moved to the second position by the lifting device 123 to move upward relative to the bottom surface supporting part 122*c*, the cassette 20 may rotate about the support part 22, as illustrated in FIG. 8, so that the front portion of the cassette 20 is lifted upwardly. The reason for this rotation is because the center of gravity of the cassette 20 is positioned rearwards relative to the support part 22, as described above.

While the cassette 20 may rotate in the above-described manner, the bottom surface of the cassette 20 may be supported by the bottom surface supporting part 122*c* so that the bottom surface supporting part 122*c* may restrict rotation of the cassette 20 to be within a predetermined range of angles, as described above.

In such a state in which the front portion of the cassette 20 is lifted upwardly, the wafers W received in the cassette 20 may be arranged to downwardly slope toward the bottom portion of the cassette 20, thereby preventing the wafers W from deviating through the opened front portion of the cassette 20 in the course of transferring the cassette 20.

Figure 9:
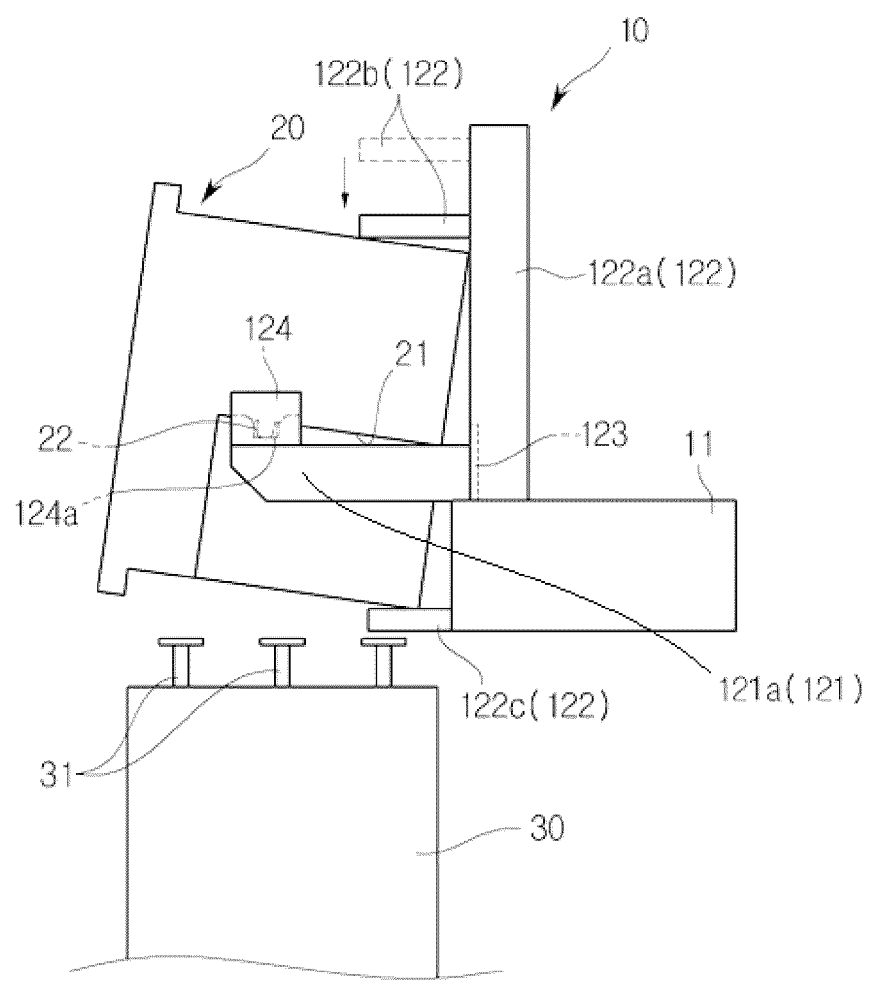

Additionally, the top surface supporting part 122*b* may be moved downwardly to elastically support the top surface of the cassette 20, as illustrated in FIG. 9. Therefore, the top surface supporting part 122*b* may reduce vibrations of the cassette 20, which may occur in the course of transferring the cassette 20.

Through the above-described procedure, the holding of the cassette 20 using the cassette transfer apparatus 10 may be completed so that the cassette transfer apparatus 10 may then be moved, thereby stably transferring the cassette 20.

Figure 10:
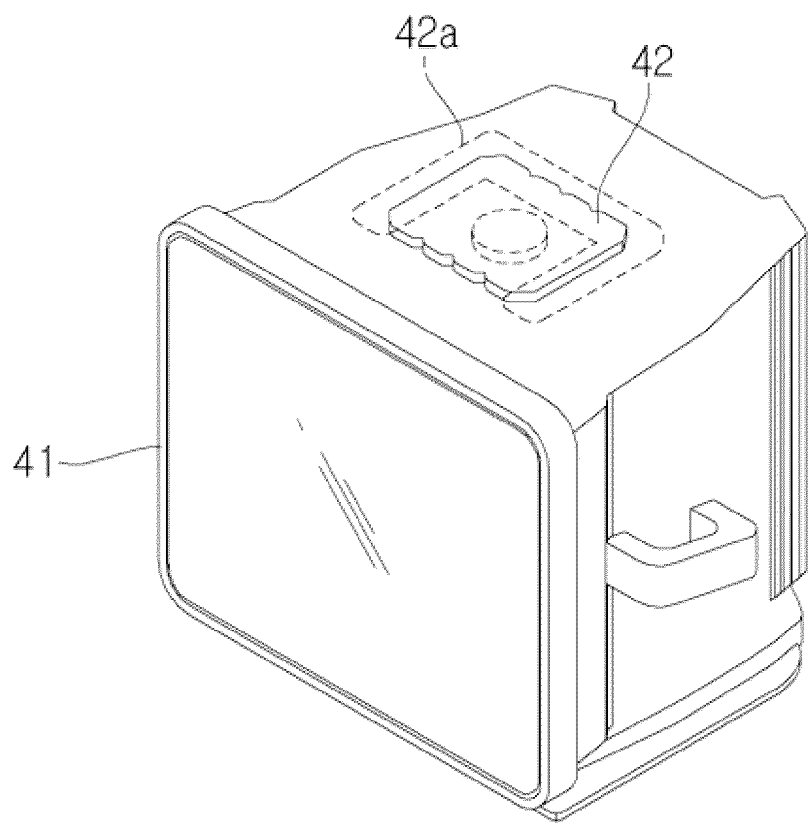
FIG. 10 is a perspective view of a front open unified pod (FOUP) type cassette transferred by a cassette transfer apparatus according to an embodiment of the present inventive concept.
Figure 11:
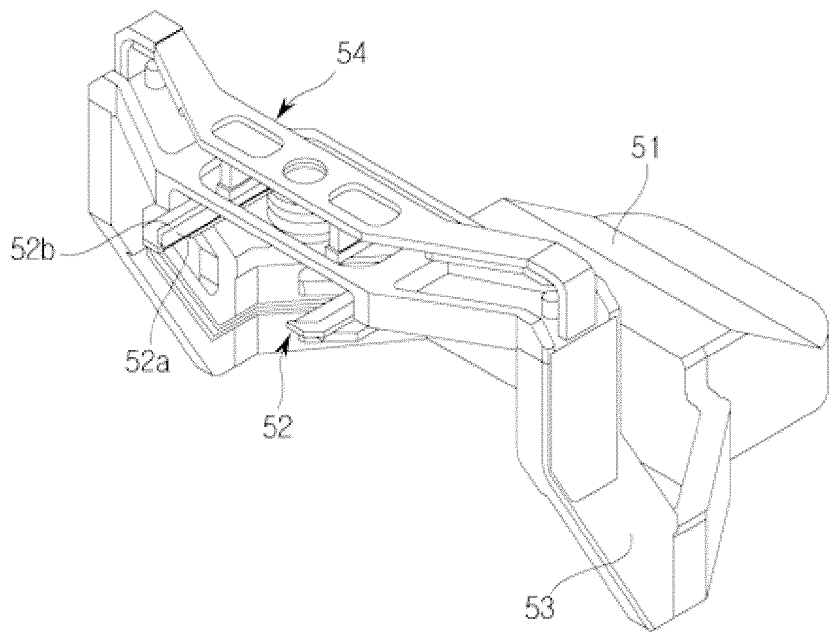
FIG. 11 is a perspective view of a cassette transfer apparatus according to an embodiment of the present inventive concept.
Figure 12:
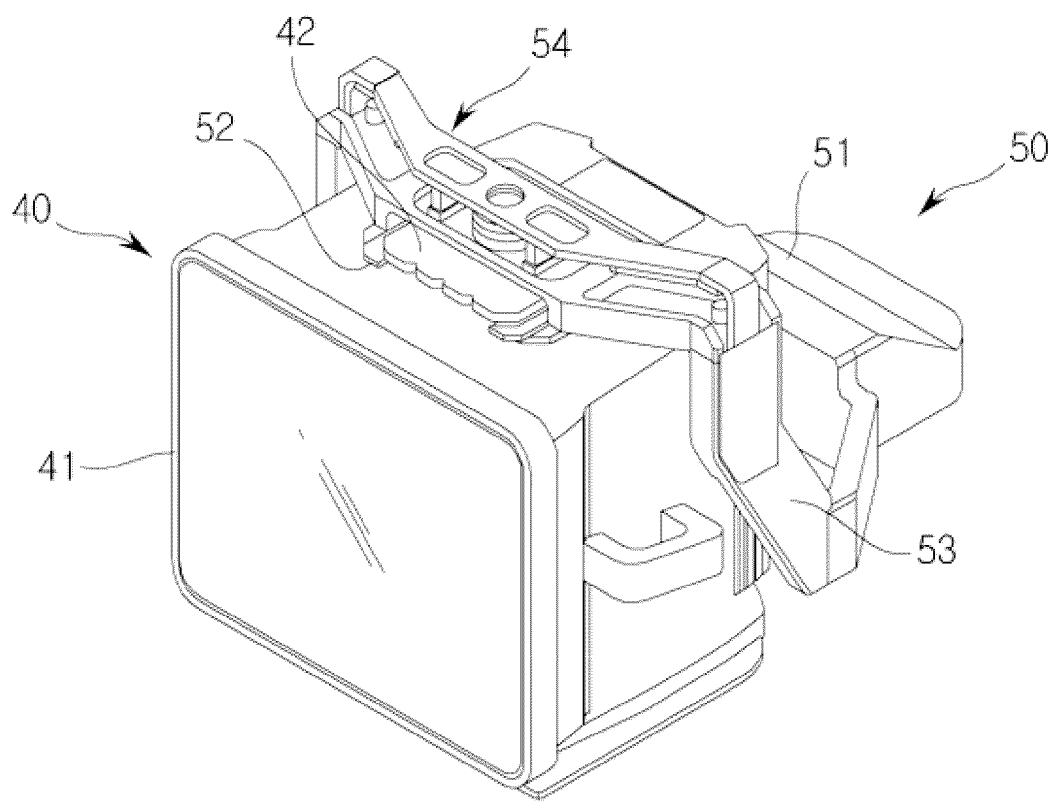
FIG. 12 is a perspective view illustrating a state in which the cassette transfer apparatus illustrated in FIG. 11 holds a FOUP type cassette.

In the embodiment of the present inventive concept illustrated in FIGS. 1-9, the cassette transfer apparatus 10 configured to transfer the FOSB type cassette 20 has been described by way of example, but the present inventive concept is not limited to this configuration. As illustrated in FIGS. 10 to 12, the above-described transferring method may also be applied to a cassette transfer apparatus 50 configured to transfer a front open unified pod (FOUP) type cassette 40 provided with a door 41 to open/close a front surface of the cassette 40.

The open front surface of the cassette 40 may be closed by the door 41. A flange 42 may be substantially shaped like a regular plate and may be disposed on the FOUP type cassette 40. Opposite side ends of the flange 42 and an end of a rear surface of the flange 42 may be installed on the cassette 40 in a manner so as to be spaced apart from a top surface of the cassette 40. The opposite side ends of the flange 42 and the end of the rear surface of the flange 42 may be used as stepped parts 42*a*, which are configured to be held by the cassette transfer apparatus 50.

The cassette transfer apparatus 50 configured to transfer the FOUP type cassette 40 may include a body 51, a holding part 52 configured to hold the stepped part 42*a* of the flange 42, and a connection arm 53 that extends forward and upward from the body 51 and is configured to connect the body 51 to the holding part 52.

The holding part 52 may have a "U" shape that corresponds to a shape formed by the opposite side ends and the rear end of the flange 42. A mounting groove 52*a* may be recessed within the holding part 52 to allow the opposite side ends and the rear end of the flange 42 to be mounted therein. In addition, the holding part 52 may have a guide surface 52*b* that extends in a downward slope toward the mounting groove 52*a* and is configured to guide the flange 42 to the mounting groove 52*a*.

The holding part 52 may further include an elastic support unit 54 provided on the connection arm 53 configured to elastically support the flange 42 held in the holding part 52, which may reduce vibrations of the cassette 40, which may occur during transferring of the cassette 40.

FIG. 13 is a flow chart illustrating a cassette transferring method according to an embodiment of the present inventive concept. In an operation 1302, a holding part, of a cassette transfer apparatus and configured to hold a bottom surface of a stepped part provided in a cassette, may be moved to a first position at which a height difference between a top surface of a mounting groove of the holding part and a top surface of a bottom surface supporting part, of the cassette transfer apparatus and configured to support a bottom surface of the cassette, becomes equal to a height difference between the bottom surface of the stepped part and the bottom surface of the cassette. At an operation 1304, the holding part and the bottom surface supporting part may be horizontally moved to allow the holding part to move to a bottom portion of the stepped part while allowing the bottom surface supporting part to move to a bottom portion of the bottom surface of the cassette. Optionally, at an operation 1306, a support part, which protrudes downward from the stepped part, may be engaged with a supporter provided in the holding part. At an operation 1308, the holding part and the bottom surface supporting part may be lifted to allow the bottom surface of the stepped part to be supported on the top surface of the holding part and to allow the bottom surface of the cassette to be supported on the top surface of the bottom surface supporting part. Optionally, at an operation 1310, a top surface supporting part may be lowered to elastically support a top surface of the cassette. Optionally, at an operation 1312, the holding part may be moved to a second position at which the height difference between the top surface of the mounting groove of the holding part and the top surface of the bottom surface supporting part is greater than the height difference between the bottom surface of the stepped part and the bottom surface of the cassette, so that a front portion of the cassette is lifted upward.

FIG. 14 is a flow chart illustrating a method of transferring a cassette according to an embodiment of the present inventive concept. At an operation 1402, a cassette transfer apparatus may be horizontally moved to the cassette. At an operation 1404, a stepped part of the cassette may be caused to be supported by a first part of the cassette transfer apparatus and a bottom surface of the cassette may be caused to be supported by a second part of the cassette transfer apparatus. At an operation 1406, the first part of the cassette transfer apparatus may be lifted by a greater distance than the second part of the cassette transfer apparatus so that the cassette rotates within a range of angles. Optionally, at a step 1408, an elastic part of the cassette transfer apparatus may be caused to support a top surface of the cassette.

The present general inventive concept can also be embodied as computer-readable codes on a computer-readable medium. For example, one of skill in the art understands that the methods illustrated in FIGS. 13 and 14 may be performed under the control of an electronic controller. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A cassette transfer apparatus comprising:
   a body;
   first and second arms connected to the body, the first and second arms extending parallel to each other to a first direction, the first and second arms configured to support a cassette;
   a third arm extending parallel to the first and second arms, the third arm configured to support the bottom surface of the cassette; and
   a first recess formed on a distal portion of the first arm and a second recess formed on a distal portion of the second arm, the first and second recesses each configured to receive a corresponding protrusion of the cassette so that the first and second recesses provide pivot points to define a rotating axis of the cassette, extending in a second direction from the first recess to the second recess, wherein the cassette transfer apparatus is configured to support the cassette in a first position in which the cassette is supported by the first and second arms with a bottom surface of the cassette being horizontal, and to support the cassette in a second position in which the cassette is supported by the first and second arms with a bottom surface of the cassette being positioned at a non-zero angle with respect to an upper surface of the third arm so that a first side of the cassette is raised with respect to a second side of the cassette opposite the first side of the cassette, wherein the cassette transfer apparatus is configured to support the cassette in each of the first position and the second position while the protrusions of the cassette are received by the first and second recesses.

2. The apparatus of claim 1, wherein each of the first and second recesses comprise:
a bottom surface;
a first side wall having a face parallel to the first direction and connecting with the bottom surface at an obtuse angle.

3. The apparatus of claim 2, wherein first side walls of the first and second recesses face each other and the rotating axis extends between the first side walls of the first and second recesses with an unobstructed line of sight when no cassette is mounted on the cassette transfer apparatus.

4. The apparatus of claim 3, further comprising:
wherein the first and second arms are configured to move with respect to the third arm in a vertical direction.

5. The apparatus of claim 4,
wherein the first and second arms are configured to move with respect to the third arm to alter a distance therebetween,
wherein a first positioning of the first, second and third arms allows the first and second recess to receive the respective corresponding protrusion of the cassette while the third arm is flush with and supporting the bottom surface of the cassette, and
wherein a second positioning of the first, second and third arms allows the first and second recess to receive the respective corresponding protrusion of the cassette while the third arm is not flush with the bottom surface of the cassette and supports the bottom surface of the cassette,
wherein a vertical distance between the third arm and the first and second arms is greater in the second positioning than in the first positioning.

6. The apparatus of claim 5, further comprising:
a fourth arm extending configured to contact the top surface of the cassette during transferring the cassette.

7. The apparatus of claim 6, further comprising:
a column extending lengthwise in a vertical direction, connected to the body, and supporting the first to fourth arms,
wherein, the first to fourth arms are supported by the column.

8. The apparatus of claim 2, wherein the sloped first side wall is configured to guide the protrusion into the recess.

9. The apparatus of claim 1, further comprising:
a vertical column connected to the body, the column supporting the first and second arms,
wherein, the first and second arms are part of a 'U' shaped support movably connected to the column.

10. The apparatus of claim 1, wherein the recess comprises:
a bottom surface;
a first, second, and third side walls connected to the bottom surface; and
an open side opposite the first side wall,
wherein at least one of the side walls is sloped.

11. A cassette transfer apparatus comprising:
a body;
first and second arms connected to the body and extending horizontally, the first and second arms configured to support two sides of a cassette;
a first recess formed on a distal portion of the first arm and a second recess formed on a distal portion of the second arm, the first and second recesses each configured to receive a corresponding protrusion of the cassette so that the first and second recesses provide pivot points to define a rotating axis, extending in a second direction from the first recess to the second recess, about which the cassette rotates; and
a third arm extending horizontally, the third arm configured to support the bottom of the cassette,
wherein the first and second arms are configured to move vertically with respect to the third arm,
wherein the recess comprises a bottom surface, a first side wall sloped to the bottom surface, and an open side.

12. The apparatus of claim 11, further comprising:
a column connected to the body and extending vertically,
wherein the first and second arms are moveably attached to the column.

13. The apparatus of claim 12, further comprising:
a fourth arm extending horizontally from the column,
wherein the fourth arm is configured to contact a top portion of the cassette.

14. The apparatus of claim 11,
wherein a first positioning of the first, second and third arms allows the first and second recess to receive the respective corresponding protrusion of the cassette while the third arm is flush with and supporting the bottom surface of the cassette, and
wherein a second positioning of the first, second and third arms allows the first and second recesses to receive the respective corresponding protrusion of the cassette while the third arm is not flush with the bottom surface of the cassette and supports the bottom surface of the cassette,
wherein a vertical distance between the third arm and the first and second arms is greater in the second positioning than in the first positioning.

15. The apparatus of claim 14, further comprising:
a column connected to the body, the column extending vertically and supporting the first to third arms,
wherein, the third arm is connected directly to the column and the first and second arms are part of a 'U' shaped support movable connected to the column.

16. The apparatus of claim 15, wherein the sloped first side wall is configured to guide the protrusion into the recess.

17. The apparatus of claim 11, further comprising:
a column connected to the body, the column extending vertically,
wherein, the third arm is connected directly to the column and the first and second arms are part of a 'U' shaped support movable connected to the column.

18. The apparatus of claim 11, wherein the recess further comprises:
- a second and third side walls connected to the bottom surface; and
- the open side opposite the first side wall.

19. An apparatus comprising:
- a body;
- first and second arms connected to the body, the first and second arms extending parallel to each other to a first direction, the first and second arms configured to support a cassette;
- a first recess formed on a distal portion of the first arm and a second recess formed on a distal portion of the second arm, the first and second recesses each configured to receive a corresponding protrusion of the cassette so that the first and second recesses provide pivot points to define a rotating axis of the cassette, the rotating axis extending in a second direction from the first recess to the second recess; and
- a first supporting surface physically connected to the first and second arms, wherein the first and second recesses are movable with respect to the first supporting surface in a vertical direction,
- wherein the first recess of the first arm, the second recess of the second arm, and the first supporting surface are configured to support the cassette in a first positioning of the cassette where a bottom surface of the cassette is horizontal,
- wherein the first recess of the first arm and the second recess of the second arm are configured to support the cassette in a second positioning of the cassette where a bottom surface of the cassette is at an incline with respect to horizontal,
- wherein the apparatus is configured to perform a transition between the first positioning and the second positioning by moving the first and second recesses with respect to the first supporting surface in the vertical direction to provide a rotation of the cassette with respect to the rotating axis.

20. The apparatus of claim 19, wherein the apparatus comprises the cassette, the cassette comprising:
- a body having a top surface, the bottom surface, a rear surface extending between the top surface and the bottom surface, and two opposing side surfaces extending between the top surface and the bottom surface and positioned at opposite edges of the rear surface, the body including an opening opposite the rear surface to receive a plurality of wafers; and
- first and second protrusions respectively formed on the two opposing side surfaces along the rotating axis of the cassette and rotatably positioned in the first and second recesses.

* * * * *